(12) United States Patent
Dujardin et al.

(10) Patent No.: US 6,279,020 B1
(45) Date of Patent: Aug. 21, 2001

(54) PROGRAMMABLE CIRCUIT FOR REALIZING A DIGITAL FILTER

(75) Inventors: Eric Dujardin; Olivier Gay-Bellile, both of Paris (FR)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/212,365

(22) Filed: Dec. 15, 1998

(30) Foreign Application Priority Data

Dec. 23, 1997 (FR) .................................................. 97 16306

(51) Int. Cl.⁷ ...................................................... G06F 17/10
(52) U.S. Cl. ........................................... 708/316; 708/320
(58) Field of Search ................................... 708/303, 316, 708/319–320

(56) References Cited

U.S. PATENT DOCUMENTS

| | | | |
|---|---|---|---|
| 5,886,912 | * 3/1999 | Miyake et al. | 708/316 |
| 5,933,797 | * 8/1999 | Håakansson et al. | 708/316 |
| 5,956,262 | * 9/1999 | Comminges et al. | 708/316 |

FOREIGN PATENT DOCUMENTS

0732809A1     9/1996   (EP) ............................. H03H/17/02

OTHER PUBLICATIONS

"VLSI Programmable Digital Filter For Video Signal Processing", Journal of VLSI, pp. 220–231, 1993.

* cited by examiner

Primary Examiner—Tan V. Mai

(57) ABSTRACT

An apparatus having plurality of filter processing elements is provided in order to obtain adequate calculation power, particularly to enable a plurality of filters to be calculated by multiplexing. The calculation of a filter is effected in a plurality of iterations; a filter section is calculated in each iteration while the same operator is used for iteratively calculating a plurality of operations and a plurality of multiplexed filters; in each iteration a plurality of data sets is used. Each filter processing element comprises a number of partial-result registers (y-data) equal to the number of filters that can be multiplexed. Each register has a write input connected to the output (y) of a final adder and each register has a read output connected to one of the inputs (y-old) of the final adder.

8 Claims, 3 Drawing Sheets

PROGRAMMABLE CIRCUIT FOR REALIZING A DIGITAL FILTER

The present invention relates to a programmable co-processor circuit intended for use in conjunction with a main processor so as to form a digital filter, which circuit comprises a plurality of filter processing elements controlled by a control unit and each including an input data register having a read output connected to an input of at least one adder, at least one multiplier having an input connected to a result output of the adder and having another input connected to a read output of a coefficient memory, and having a result output connected to an input of a final adder having an output which supplies an intermediate result of the calculation of an equation upon each cycle of a clock.

Such a circuit is notably used in applications where a plurality of filters is required, such as various so-called "multimedia" applications, for example for the reduction of intersymbol interference, for changing the data rate, or for the reduction of noise introduced by a communication channel.

A digital filter essentially comprises a series of elements between which signals are extracted, which signals are processed, notably multiplied by a coefficient and/or added, and are subsequently re-injected. To realize digital filters three methods are known:

- using a processor of the DSP type, to form a filter with the aid of specialized algorithms; although this method provides great flexibility it is limited as regards the filter performance, particularly as regards its speed,
- using dedicated circuits which directly form filters; this enables a high performance to be achieved but leads to the development of many different circuits,
- using specialized but programmable circuits; this is a satisfactory compromise between the high performance of dedicated circuits and the high flexibility of a DSP processor; specialized programmable filters include programmable filters using a processor, which means that they are essentially constituted by a DSP processor stripped down to the minimum necessary for the process to be performed in a filter. This is the most interesting solution.

A specialized programmable circuit comprises registers for the storage of programmable coefficients. It is generally configured to realize a given type of filter: symmetrical, half-band, interpolation, decimation, adaptive, complex. Such a programmable filter comprising a processor is known from the document EP 0 732 809. The processor in accordance with said document is capable of calculating two filters arranged in cascade and having the same clock frequency. It uses two registers for alternately storing the partial results of the two filters.

It is an object of the invention to provide a programmable circuit which enables multiplexing of different types of filter, even when they have different data formats and different data input rates.

To this end, for multiplexing a plurality of different filters, each filter processing element further comprises a number of partial-result registers, which number is equal to the desired number of filters to be multiplexed, each register has a write input connected to the output of the final adder, and each register has a read output connected to one of the inputs of the final adder.

Thus, a plurality of filters having different data formats, real or complex, can be processed.

Other special embodiments of the invention are defined in the claims 2 to 8.

These and other more detailed aspects of the invention will become apparent from the following description of an embodiment of the invention given by way of non-limitative example.

Figure 5:
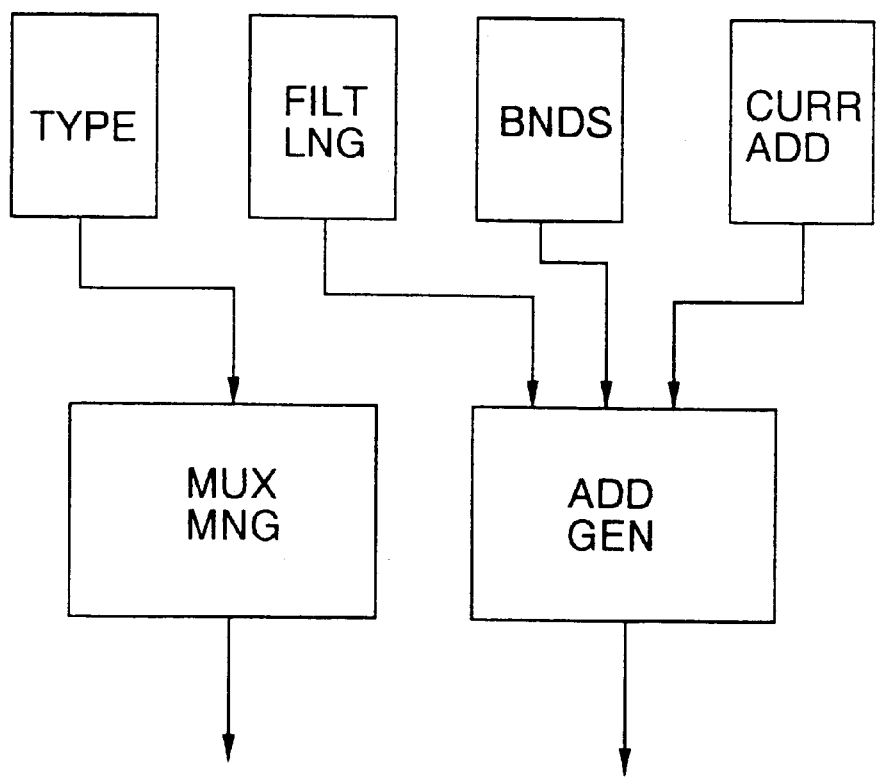

FIG. 5 diagrammatically shows the organization of a control unit of the circuit.

As a basis for realizing different types of filter finite impulse response filters are used: each different type of filter is in fact a finite impulse response filter whose characteristics are obtained by reducing or increasing the complexity of a standard filter. The filter types that can be processed by the circuit are the following:

symmetrical filters: they have symmetrical coefficients, which enables the multipliers and memories to be simplified considerably. As a matter of fact, for a filter having a length L only $\lceil L/2 \rceil$ coefficients, $\lceil L/2 \rceil$ multiplications and L-1 additions are necessary. The equation of a symmetrical filter is:

$$y(n) = \sum_{k=0}^{\lceil \frac{L}{2} \rceil - 1} (x(n-k) + x(n-L-k+1)) \times w_k \qquad (1)$$

where x(1) is the input signal at the instant i, n represents the time clocked by a known clock, not shown, k is the number of a coefficient, and $w_k$ is a coefficient corresponding to the coefficient k.

adaptive filters: these are filters capable of adapting to a communication channel by adapting the coefficients so as to minimize an error signal.

The equation of an adaptive filter is:

$$y(n) = \sum_{k=0}^{L-1} x(n-k) \times w_k \qquad (2)$$

in which:

$$w_k(n+1) = w_k(n) - K \times e(n) \times x(n-k)^* \qquad (3)$$

where K corresponds to the adaptation step, x(n–i)* is the complex conjugate of x(n–i) if the data are complex, and e(n) is the error of the result. The error is calculated by the host processor. This algorithm uses complete multiplications and, in order to reduce the complexity, a signed version is used for calculating the error and the data, which improves the calculation speed:

$$w_k(n+1) = w_k(n) - K \times \text{sgn}(e(n)) \times \text{sgn}(x(n-k)^*) \qquad (4)$$

decimation filters: these are filters in which the data rate at the output is lower than at the input. The equation of a decimation filter is:

$$y(n) = \sum_{k=0}^{L-1} x(dn-k) \times w_k \quad (5)$$

where d (integer) is the decimation factor.

Finally, an equation can be defined which is common to all the possible filter types:

$$y(n) = \sum_{k=0}^{l-1} (x(dn-k) + x(dn-L+k+1)) \times w_k \quad (6)$$

in which L is the length of the filter and l is the number of coefficients. In the case of a non-symmetrical filter the second term (x(dn−L+k+1)) is not used.

The input data format can be real or complex, which also applies to the coefficients, which makes it necessary to perform complex operations. The addition of two sets of complex data requires two real additions, the multiplication of complex data by a real coefficient requires two real multiplications, and the multiplication of two sets of complex data requires four real multiplications and two real additions.

The number of input data and coefficient values to be stored as well as the number of multiplications and additions necessary for the different algorithms which correspond to different types of finite impulse response filters are taken into account in defining the architecture of the circuit. The symmetrical filters require twice as many additions as multiplications while other filters use the same number of multiplications and additions. Since symmetrical filters are used on a large scale in digital communications and the extra cost of an adder is minimal, an architecture optimized for symmetrical filters is used. The problem of the number of coefficients and data is solved by memory sharing.

Figure 1:
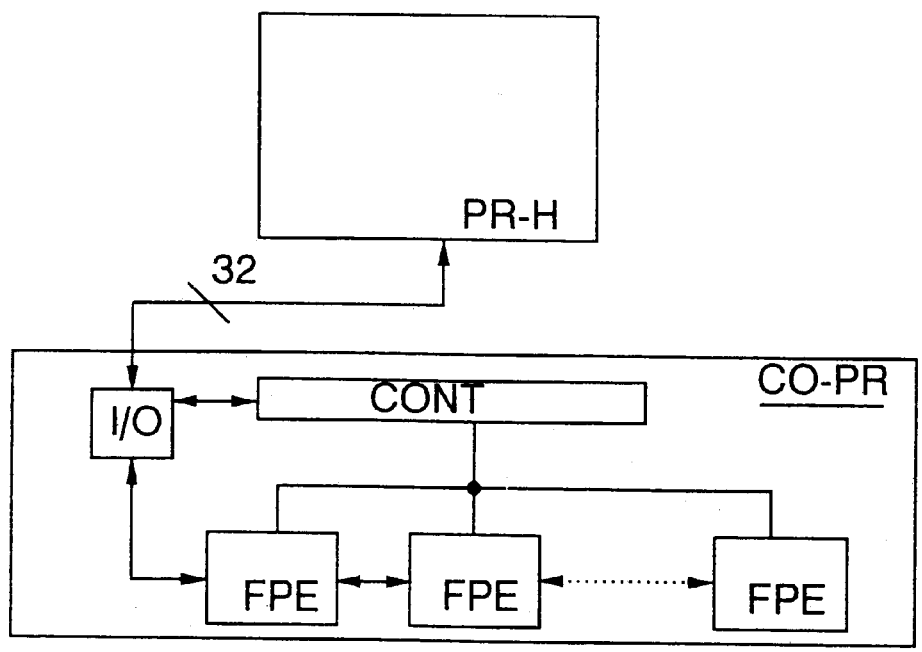
FIG. 1 represents diagrammatically a filter calculation system.

The circuit CO-PR in FIG. 1 is a co-processor associated with a host processor PR-H with which it communicates via a 32 bit bus, even when the digital filter does not require as many parallel bits. It comprises an I/O unit, which synchronizes the communication between the host processor and the co-processor, and a control unit CONT which registers the required filter characteristics and controls the actual filter processing elements FPE. A plurality of filter processing elements FPE have been provided in order to obtain the necessary calculation power, the number of said elements being designated $n_c$.

Figure 2:
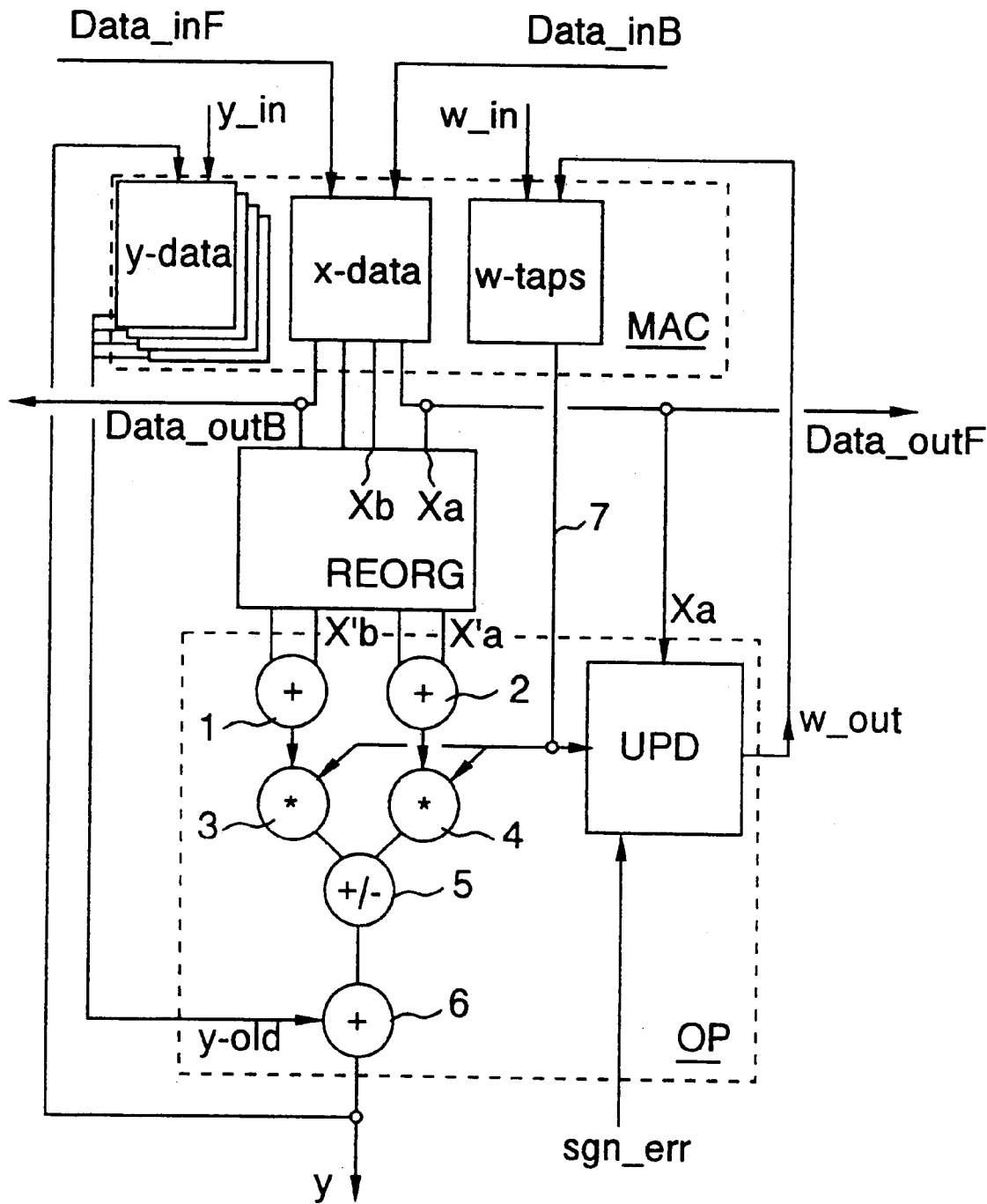
FIG. 2 is a more detailed diagram of a filter processing element.

The filter processing element of FIG. 2 comprises two main parts: an operator part OP and a memory part MAC. The operator part includes multipliers and adders for calculating the filters and the logic for updating the coefficients of the adaptive filters. The memory part includes a memory w-taps for storing all the coefficients used by the different multiplexed filters, a memory x-data for storing all the input data used by the filters, and a number NMF of registers y-data for storing the partial results of the MNF filters. The registers y-data are particularly intended for calculation with multiplexing. The input w_in serves to initialize the memory w-taps.

Data are transmitted between filter processing elements via two unidirectional lines: a "forward" line Data_inF and a "return" line Data_inB. The forward line transmits data from the right to the left; this line is used only in the case of symmetrical filters. The results are transmitted from the right to the left via the ports y_in and y.

Since the data can have a plurality of formats, since a decimation can be effected, and since the data can be real or complex, a reorganization unit REORG has been provided, which includes means for receiving input data from the input data memory x-data, to reorganize them and supply them to the first and the second adder, in such a manner that the operator part is supplied with the appropriate data. Data $X_a$ and $X_b$ coming from the register x-data and corresponding to those transmitted via the forward line are converted to X'a and X'b by this reorganization unit.

The operator part OP comprises a first adder 1 and a second adder 2, each of which has its output connected to an input of a first multiplier 3 and a second multiplier 4, respectively, which have another input which, via a connection 7, receives a coefficient value from the coefficient memory w-taps, and the first and the second multiplier each have their respective outputs connected to an input of an adder/subtracter 5 whose output is connected to an input of a third adder 6, called the final adder, the other input of this adder receiving from one of the partial result registers the result y-old obtained in the preceding cycle, and the output of this adder supplying the calculation result "y" corresponding to the current cycle. These two adders 1, 2 and multipliers 3, 4 perform the accumulations and multiplications required for the calculation of the partial results. An updating unit UPD serves to adapt the coefficients in the case of an adaptive filter. Each 32-bit multiplier 3, 4 can be used as two 16-bit multipliers so as to enable a complex 16-bit multiplication to be processed in one cycle, and each adder 1, 2 comprises two 16-bit adders. It is possible to use 8-bit words since each 16-bit operator can be regarded as two 8-bit operators. Thus, one filter processing element can handle up to twenty-four 8-bit operations at the same time. Each operator can be regarded as four 8-bit operators or as two 16-bit operators in parallel. The two adders 1, 2 are used in the case of a symmetrical filter; they are short-circuited in the other cases. The adder-subtracter 5 is used as a subtracter when this is necessary for a complex multiplication, and as an adder in the other cases. The unit OP implements the following equation:

$$Y(\text{new}) = Y(\text{old}) + (X'a + X'aB) \times W_0 \pm (X'b + X'bB) \times w_1$$

where ± is either an addition (in the case of a real coefficient, parts in quadrature or a complex multiplication), or a subtraction (in the case of in-phase parts of a complex multiplication); $w_0$ and $w_1$ are either two consecutive real coefficients or one complex coefficient; X'a and X'b are input data of the forward line; X'aB and X'bB are input data of the return line, their values being zero if the filter is not symmetrical; y(new) is the value, calculated last, of the partial result y, while y-old is either the preceding value of y or the partial result of another filter processing element y_in.

Figure 3:
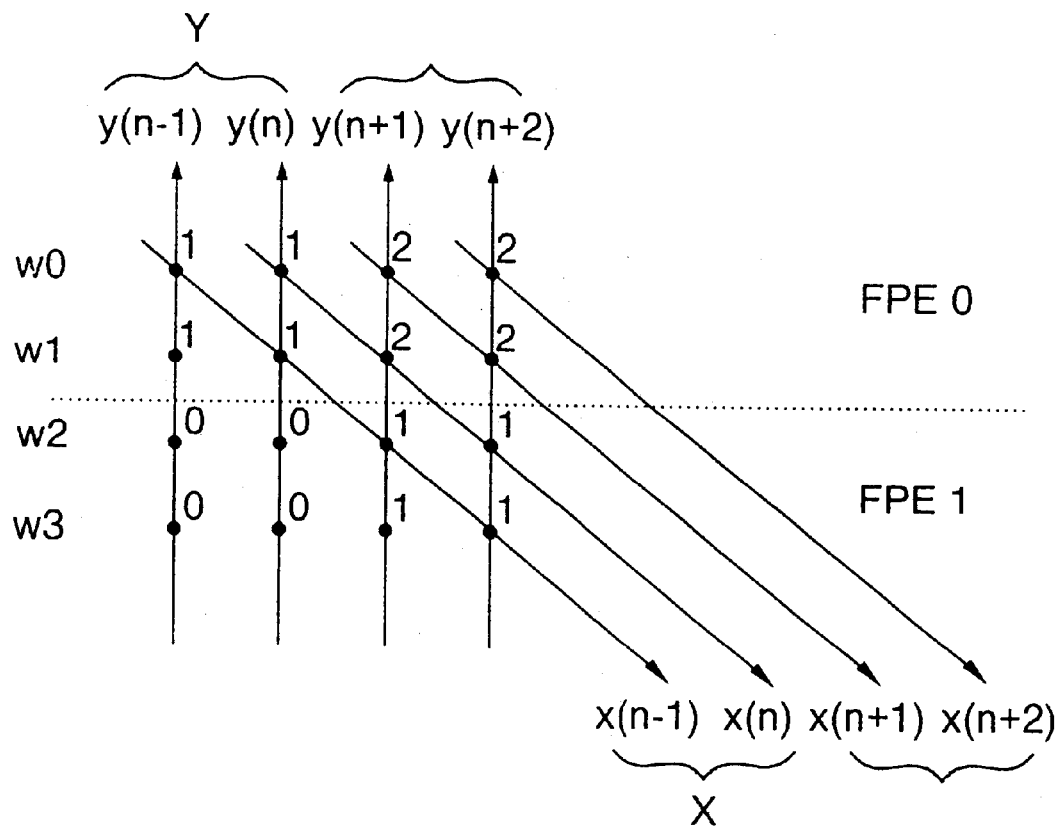
FIG. 3 is a diagram illustrating the progress of a calculation.
Figure 4:
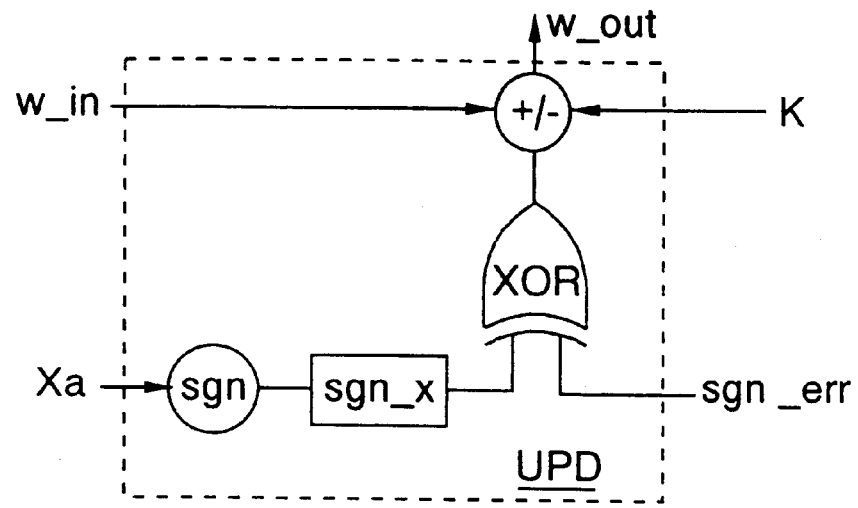
FIG. 4 is a diagram of an updating element of the filter processing element of FIG. 2.

The updating unit UPD, which is shown in more detail in FIG. 4, receives data "sgn_err" calculated by the host processor in the case of an adaptive filter and carries out the algorithm represented by the equation 3. Owing to the pipeline organization and the time required for communication between the co-processor and the host processor the error is available with a certain delay and the sign of the data is stored during this time. The unit therefore comprises a register sgn_x for storing the sign sgn of the data Xa while waiting for the sign sgn_err of the error to be calculated; it further comprises an exclusive-or gate XOR having two inputs to which the sign sgn and the sign sgn_err are applied, respectively, in order to generate a sign bit, and having its output connected to an input of an adder-subtracter ± which has another input which receives a coefficient value w_in from the memory w-taps via the connection 7 of FIG. 3 and which has yet another input which receives an constant K which is internal to the unit and corresponds to the adaptation step. The adder-subtracter supplies a coefficient value w_out to be stored in the coefficient memory.

FIG. 3 illustrates the progress of the calculation in the time domain for a filter having four coefficients w0, w1, w2, w3 by means of two filter processing elements FPE0 and FPE1. A dot corresponds to the calculation of a coefficient. The number near each dot indicates the calculation instant. A set of four calculations are carried out at the same instant by the same filter processing element. A vertical arrow illustrates the propagation of the results y(n), the diagonal arrows illustrate the spatial progression of the x data subwords. The subdivision into subwords does not change the calculation of a result but only changes the progression of the data between different calculation results. A plurality of data is used in each iteration (data in the grey rectangle); the first one is used by the top-right dot while the last one corresponds to the bottom-left dot. x(dn) is used for the calculation of y(n) corresponding to the top-right dot, x(dn−$n_r$+1) is used for the calculation of y(n) corresponding to the bottom-right dot, and x(d(n−$p_x$+1)) is used for the calculation of y(n−$P_x$+1) corresponding to the top-left point. Thus, the number of data to be read is $R_p$=($p_x$−1)d+$n_r$. Moreover, each 32-bit word comprises $p_x$ data so that the number of adjacent 32 bit words to be read is:

$$R_{32} = d + \left[\frac{1}{P_x}\left(\frac{n_m}{T_c} - d\right)\right]$$

Thus, the number of read-outs increases with d. With two read ports for the memory x-data it is possible to realize filters with decimation by a factor of two. In the case of symmetrical filters twice as many input data are used simultaneously for each of the partial results ($n_r$=1 or 2); consequently, since only 16-bit and 8-bit calculations are permissible, a 32-bit read-out is necessary for the memory w-taps; $P_x$ successive partial results are used so that a 32-bit read-out is necessary for the registers y-data.

To initialize or update the coefficients a 32-bit read-in is necessary for the memory w-taps; $p_c$ successive real products are stored and a 32-bit read-in is also necessary for the registers y-data. During the calculation of a new set of results $p_x$, $dp_x$ new input data arrive; if there is no decimation a 32-bit read-in is necessary for the memory x-taps; in the case of decimation filters a plurality of iterations are necessary to store the data owing to the limited pass band of the link with the host processor ($p_x$ data in each cycle).

Each filter is divided into smaller filters of identical length which are calculated simultaneously in a systolic manner; thus, each filter processing element calculates a filter having the same characteristics; it requires the same controls as the other filters. Therefore, a single control unit is adequate regardless of the number of filter processing elements. The control unit of FIG. 5 comprises four registers having a size NMF, where NMF is the maximum number of filters that can be multiplexed. This control unit has several functions:

it stores the characteristics of each filter, such as the number of coefficients, in a register "TYPE", it stores the current memory addresses in a register "CUR ADR", and it stores the upper and lower limits of the used parts of the data and coefficient registers in a register "BNDS", by means of a unit "ADD GEN" it generates the addresses necessary for the filter processing elements, it controls the reorganization unit as well as the communication between the filter processing elements.

The management unit MUX MNG is a combinatorial logic circuit which controls the data communication in the co-processor as function of the filter type.

What is claimed is:

1. A programmable co-processor circuit intended for use in conjunction with a main processor so as to form a digital filter, which circuit comprises a plurality of filter processing elements controlled by a control unit and each including an input data register having a read output connected to an input of at least one adder, at least one multiplier having an input connected to a result output of the adder and having another input connected to a read output of a coefficient memory, and having a result output connected to an input of a final adder having an output which supplies an intermediate result of the calculation of an equation upon each cycle of a clock, characterized in that, for multiplexing a plurality of different filters, each filter processing element further comprises a number of partial-result registers (y-data), which number is equal to the desired number of filters to be multiplexed, each register has a write input connected to the output of the final adder (6), and each register has a read output connected to one of the inputs (y-old) of the final adder.

2. A programmable co-processor circuit as claimed in claim 1, characterized in that each filter processing element comprises two adders which each receive two sets of input data to be added from the input data memory.

3. A programmable co-processor circuit as claimed in claim 2, characterized in that it comprises a data reorganization unit which includes means for receiving input data from the input data memory, in order to reorganize said data and supply said data to the two adders.

4. A programmable co-processor circuit as claimed in claim 2, characterized in that each filter processing element includes two multipliers, each having an input connected to a result output of one of the two adders.

5. A programmable co-processor circuit as claimed in claim 4, characterized in that the two multipliers each have an output connected to an input of an adder/subtracter which has an output connected to an input of the final adder.

6. A programmable co-processor circuit as claimed in claim 1, characterized in that it includes an updating unit having means for processing coefficients obtained from the coefficient memory and re-loading them into this memory.

7. A programmable co-processor circuit as claimed in claim 6, characterized in that the updating unit includes an exclusive-or gate having two inputs which respectively receive a data signal from the data memory and an error signal from the main processor, and having an output connected to an input of an adder which receives a coefficient value from the coefficient memory at another input, and includes means for supplying a coefficient value to be stored into the coefficient memory.

8. A programmable co-processor circuit as claimed in claim 1, characterized in that the control unit comprises a plurality of register units which each comprise a number of registers equal to the number of filters that can be multiplexed, for storing characteristics of each filter and current memory addresses.

* * * * *